(12) United States Patent
Sekine et al.

(10) Patent No.: US 9,349,720 B2
(45) Date of Patent: May 24, 2016

(54) INTEGRATED CIRCUIT DEVICE

(71) Applicant: NAPRA CO., LTD., Tokyo (JP)

(72) Inventors: Shigenobu Sekine, Tokyo (JP); Yurina Sekine, Tokyo (JP)

(73) Assignee: NAPRA CO., LTD., Tokyo (JP)

( * ) Notice: Subject to any disclaimer, the term of this patent is extended or adjusted under 35 U.S.C. 154(b) by 0 days.

(21) Appl. No.: 14/341,956

(22) Filed: Jul. 28, 2014

(65) Prior Publication Data

US 2015/0035114 A1   Feb. 5, 2015

(30) Foreign Application Priority Data

Aug. 5, 2013   (JP) .................................. 2013-162647

(51) Int. Cl.
 *H01L 29/00* (2006.01)
 *H01L 27/04* (2006.01)
 *H01L 27/06* (2006.01)
 *H01L 21/02* (2006.01)
 *H01L 49/02* (2006.01)

(52) U.S. Cl.
 CPC .......... *H01L 27/04* (2013.01); *H01L 21/02211* (2013.01); *H01L 27/0676* (2013.01); *H01L 28/90* (2013.01); *H01L 2924/0002* (2013.01)

(58) Field of Classification Search
 CPC .............. H01L 27/04; H01L 21/02211; H01L 27/0676
 See application file for complete search history.

(56) References Cited

U.S. PATENT DOCUMENTS

| 2004/0016962 | A1* | 1/2004 | Okumura et al. | ............. 257/330 |
| 2007/0274014 | A1 | 11/2007 | Berberich et al. | |
| 2010/0314714 | A1* | 12/2010 | Nakamura | ..................... 257/531 |
| 2013/0075930 | A1 | 3/2013 | Sekine et al. | |
| 2015/0041990 | A1* | 2/2015 | Sekine et al. | ................. 257/774 |

FOREIGN PATENT DOCUMENTS

| EP | 2388814 A2 | 11/2011 |
| JP | 1-281747 A | 11/1989 |
| JP | 2010-67916 A | 3/2010 |
| JP | 2012-186300 A | 9/2012 |

OTHER PUBLICATIONS

Extended European Search Report dated Feb. 13, 2015, issued in corresponding EP Patent Application No. 14179869.4 (8 pages).

* cited by examiner

*Primary Examiner* — A. Sefer (74) *Attorney, Agent, or Firm* — Westerman, Hattori, Daniels & Adrian, LLP (57) ABSTRACT

An integrated circuit device includes a semiconductor substrate, an active element and a passive element. The active element is made of the semiconductor substrate. The passive element includes a functional element filled in a groove or hole provided in the semiconductor substrate along a thickness direction thereof and is electrically connected to the active element. The functional element has a Si—O bond region obtained by reacting Si particles with an organic Si compound.

4 Claims, 9 Drawing Sheets

INTEGRATED CIRCUIT DEVICE

BACKGROUND OF THE INVENTION

1. Field of the Invention

The present invention relates to an integrated circuit device with active and passive elements built in a semiconductor substrate.

2. Description of the Related Art

In the technical field of integrated circuit device in which an active element such as transistor and a passive element such as resistor, capacitor or inductor are integrated on a semiconductor substrate, the 3D packaging is rapidly becoming mainstream instead of the conventional SMT (surface mount technology). Particularly, owing to an increasing demand for miniaturization, high speed and low power consumption, there has been a remarkable progress in the 3D-SiP technology, where the 3D packaging is combined with SiP (system in package) in which a system composed of a plurality of LSIs is enclosed in a single package. The SiP also has an advantage in reducing the power consumption, shorting the development times and reducing the cost. The integration of an advanced system can be achieved by the combination of the SiP and the 3D packaging which enables high density packaging.

As an essential technology for the above-mentioned 3D packaging, there has been known a TSV (through silicon via) technology. By using the TSV technology, a great deal of functionality can be packed into a small footprint, and critical electrical paths through the device can be drastically shortened, leading to faster operation.

However, since passive elements are to be mounted with connectors for the passive elements (pads) formed one surface of a semiconductor substrate for active elements, there is a limit to reducing the height and size of the integrated circuit device.

On the other hand, Japanese Unexamined Patent Application Publication No. 2010-67916 discloses an integrated circuit device having a first substrate and a second substrate. The first substrate is composed of a semiconductor substrate. An active element is formed on one surface of the first substrate with a first through electrode passing through the first substrate. A passive element is formed on one surface of the second substrate with a second through electrode passing through the second substrate. The other surface of the first substrate faces the other surface of the second substrate. The first through electrode is electrically connected to the second through electrode.

However, since the semiconductor substrate having the active element has to be connected to the substrate having the passive element, there is also a limit to reducing the height and size.

SUMMARY OF THE INVENTION

It is an object of the present invention to provide a thin integrated circuit device in which active and passive elements are arranged at high density.

In order to attain the above object, an integrated circuit device according to the present invention comprises a semiconductor substrate, an active element and a passive element. The active element is made of the semiconductor substrate. The passive element includes a functional element filled in a groove or hole provided in the semiconductor substrate along a thickness direction thereof and is electrically connected to the active element. The functional element has a Si—O bond region obtained by reacting Si particles with an organic Si compound.

In the present invention, the active element is made of the semiconductor substrate. Specifically, the active element such as semiconductor element is made by performing a common semiconductor fabrication process such as impurity doping on the semiconductor substrate. Therefore, unlike in the case where active elements are surface-mounted on a substrate, the semiconductor substrate itself can be utilized to provide a thin integrated circuit device in which active elements are arranged at high density. The active element is a semiconductor element or a semiconductor circuit element thereof, including not only two-terminal or three-terminal active elements but also a combination thereof or an integration thereof.

In the present invention, since the functional element of the passive element is filled in the groove or hole provided in the semiconductor substrate along the thickness direction thereof and is electrically connected to the active element, the built-in passive element does not increase the thickness of the semiconductor substrate. Thus, there can be obtained a thin integrated circuit device.

Moreover, since the functional element is filled in the groove or hole provided in the semiconductor substrate along the thickness direction thereof, the passive element can be formed by utilizing the thickness of the semiconductor substrate. Therefore, unlike the related art in which planar passive elements are arranged on the semiconductor substrate, the passive elements can be arranged at high density. Hence, it is highly suitable for the TSV technology intended for high-density packaging.

Examples of the passive element include a capacitor, a resistor, an inductor, a signal transmission element and an optical waveguide element. The term "functional element" as used herein refers to an essential part necessary for serving the function of a passive element. Examples of the functional element include a conductor, a dielectric element, a resistive element, an electrical insulator, a magnetic element and an optical waveguide. When the passive element is a capacitor, the conductor serves as a functional element of a capacitor electrode; when the passive element is an inductor or a signal transmission element, the conductor serves a functional element of an electrical signal transmission element. The resistive element serves as a functional element of a resistor. When the passive element is a capacitor, the dielectric layer serves as a functional element of an inter-electrode capacitance layer. The insulator serves as a functional element for electrically insulating other functional elements from the semiconductor substrate such as Si substrate. The magnetic element serves as a functional element for improving magnetic efficiency of an inductor or the like. The optical waveguide serves as a functional element for forming an optical waveguide element in the substrate. The functional element can be formed by covering a functional material for a conductor, a dielectric element, a resistive element, an electrical insulator, a magnetic element or an optical waveguide with a Si—O bond region obtained by reacting Si particles with an organic Si compound.

When the passive elements include a capacitor, for example, the dielectric layer serving as a functional element of the capacitor may have dielectric particles and a Si—O bond region filling up the space around the dielectric particles.

When the passive elements include at least one of an inductor or a signal transmission element, the conductor serving as a functional element of the inductor or the signal transmission element may contain a high-melting-point metallic component and a low-melting-point metallic component. The inductor may have any pattern such as a straight pattern, a zigzag pattern, a meandering pattern, a helical pattern or a spiral pattern. It is also possible use a magnetic element for the functional element, thereby improving magnetic efficiency. When the passive element is an optical waveguide element, furthermore, an optical fiber may be formed in the substrate along its thickness direction.

The integrated circuit device according to the present invention may be combined with an electronic component to provide an electronic device. The electronic component is mounted on the semiconductor substrate of the integrated circuit device and electrically connected to the active element or the passive element. A typical example of such an electronic device is a light-emitting device with a light-emitting diode. The integrated circuit device can be used as a drive circuit device for driving the light-emitting element.

According to the present invention, as has been described above, there can be provided a thin integrated circuit device in which active and passive elements are arranged at high density. Therefore, the present invention can provide a thin integrated circuit device which is highly suitable for the TSV technology intended for high-density packaging.

The present invention will be more fully understood from the detailed description given hereinbelow and the accompanying drawings which are given by way of illustration only, and thus not to be considered as limiting the present invention.

DESCRIPTION OF THE PREFERRED EMBODIMENTS

In FIGS. 1 to 9, similar components are denoted by the same or similar reference symbols. Referring first to FIGS. 1 to 4, an integrated circuit device 1 according to the present invention includes a semiconductor substrate 101, an active element Q1 and passive elements PS1, PS2. An electronic component 7 is mounted on the integrated circuit device 1.

Figure 1:
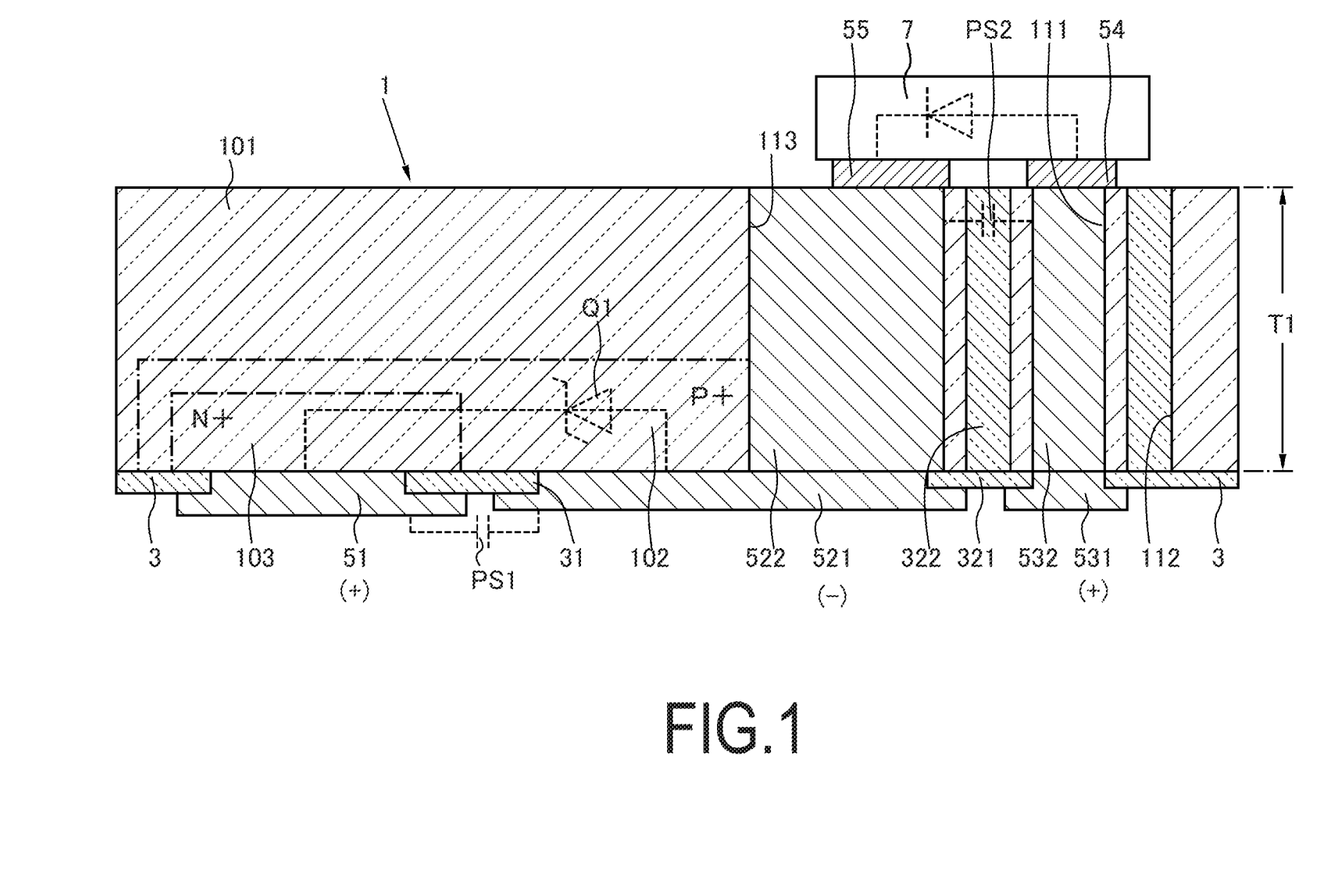
FIG. 1 is a partially sectional view showing one embodiment of an electronic device with an integrated circuit device according to the present invention.

The semiconductor substrate 101 has a flat shape with a thickness T1. The semiconductor substrate 101 may be made of any suitable material such as silicon (Si), germanium (Ge), gallium arsenide (GaAs), gallium arsenide phosphide, gallium nitride (GaN), or Silicon Carbide (SiC). In this embodiment, the semiconductor substrate 101 is a Si substrate.

The active element Q1 is made by performing a common semiconductor fabrication process such as impurity doping on the semiconductor substrate 101. Therefore, unlike in the case where active elements are surface-mounted on a substrate, it is possible to provide a thin integrated circuit device in which active elements Q1 are arranged at high density.

The active element Q1 is a semiconductor element or a semiconductor circuit element thereof, including not only two-terminal or three-terminal active elements but also a combination thereof or an integration thereof. Examples of the two-terminal elements include a rectifier diode, a zener diode, a variable capacitance diode and a varistor. Examples of the three-terminal elements include a bipolar transistor, a field effect transistor (FET), an insulated gate bipolar transistor (IGBT) and a uni-junction transistor (UST). The active element Q1 may be an integration of those two-terminal or three-terminal elements. The choice depends on the circuit configuration.

In this embodiment, the active element Q1 is a zener diode so as to form a constant-voltage circuit. Specifically, a p-n junction is formed between $P^+$ type and $N^+$ type semiconductor regions 102, 103 near a first surface of the semiconductor substrate 101.

Typically, the passive elements PS1, PS2 may be a capacitor, an inductor, a resistor or a combination thereof. They may also be a signal transmission line or an optical waveguide element. Depending on the type, functional elements of the passive elements PS1, PS2 include at least one of a conductor, a resistive element, a dielectric element, an insulator, a magnetic element or an optical waveguide.

In this embodiment, the passive elements PS1, PS2 are capacitors. The number, sectional shape and pattern thereof may be set arbitrarily. The passive element PS1 is a noise removing capacitor including a first terminal electrode 51, which serves as a capacitor electrode and a power supply terminal, a dielectric layer 31 and a second terminal electrode 521. The dielectric layer 31 is directly formed on the first surface of the semiconductor substrate 101, extending from the N-type semiconductor layer 103 to the P-type semiconductor layer 102. The first terminal electrode 51 and the second terminal electrode 521 of the passive element PS1 are formed to cover opposite ends of the dielectric layer 31 at the first surface of the semiconductor substrate 101 beneath which the active element Q1 is formed. The dielectric layer 31 is a part of a dielectric layer 3 formed on the first surface of the semiconductor substrate 101.

On the other hand, the passive element PS2 is a capacitor capable of absorbing variations in constant voltage output of the active element Q1 (zener diode) for stabilization. This passive element PS2 includes a second conductor 532, a dielectric layer 322 and a first conductor 522 as a functional element thereof.

The second conductor 532 fills up a groove-like or hole-like first element forming region 111 passing through the semiconductor substrate 101 in the thickness direction. The second conductor 532 has a rectangular shape as seen in a plan view (FIG. 2), and its opposite ends are led to the opposite surfaces (first and second surfaces) of the semiconductor substrate 101 as seen in the thickness direction. However, the second conductor 532 is not limited to the rectangular shape. Its planar shape may be a circular shape, an oval shape, a polygonal shape or a combination thereof. It may also be separated into two or more parts.

One of the opposite ends of the second conductor 532, which appears on the first surface of the semiconductor substrate 101 in the thickness direction, is connected to a positive, third terminal electrode 531, which serves as a lead-out electrode. The third terminal electrode 531 is electrically insulated from the semiconductor substrate 101 by an insulating film 321 formed on the first surface of the semiconductor substrate 101. The insulating film 321 is formed to cover one end of the dielectric layer 322. The insulating film 321 is a part of the dielectric layer 3 formed on the first surface of the semiconductor substrate 101.

The dielectric layer 322 fills up a groove-like or hole-like second element forming region 112 provided in the semiconductor substrate 101. For example, the dielectric layer 322 is ring-shaped to extend around the second conductor 532 with a distance therebetween.

The first conductor 522 fills up a groove-like or hole-like third element forming region 113 passing through the semiconductor substrate 101 in the thickness direction. Through the dielectric layer 322, the first conductor 522 faces the second conductor 532 at the entire side surface. Therefore, there is provided a passive element PS2 in which capacitance due to the dielectric layer 322 can be obtained between the first conductor 522 and the second conductor 532.

One end of the first conductor 522 appearing on the first surface of the semiconductor substrate 101 in the thickness direction is bonded to the second terminal electrode 521. The second terminal electrode 521 is electrically insulated from the semiconductor substrate 101 by the dielectric layer 31 and the insulating film 321 formed on the first surface of the semiconductor substrate 101. The first conductor 522 is not limited to the illustrated rectangular shape. It may take any shape such as a circular shape, an oval shape, a polygonal shape or a combination thereof. It may also be separated into two or more parts.

Figure 2:
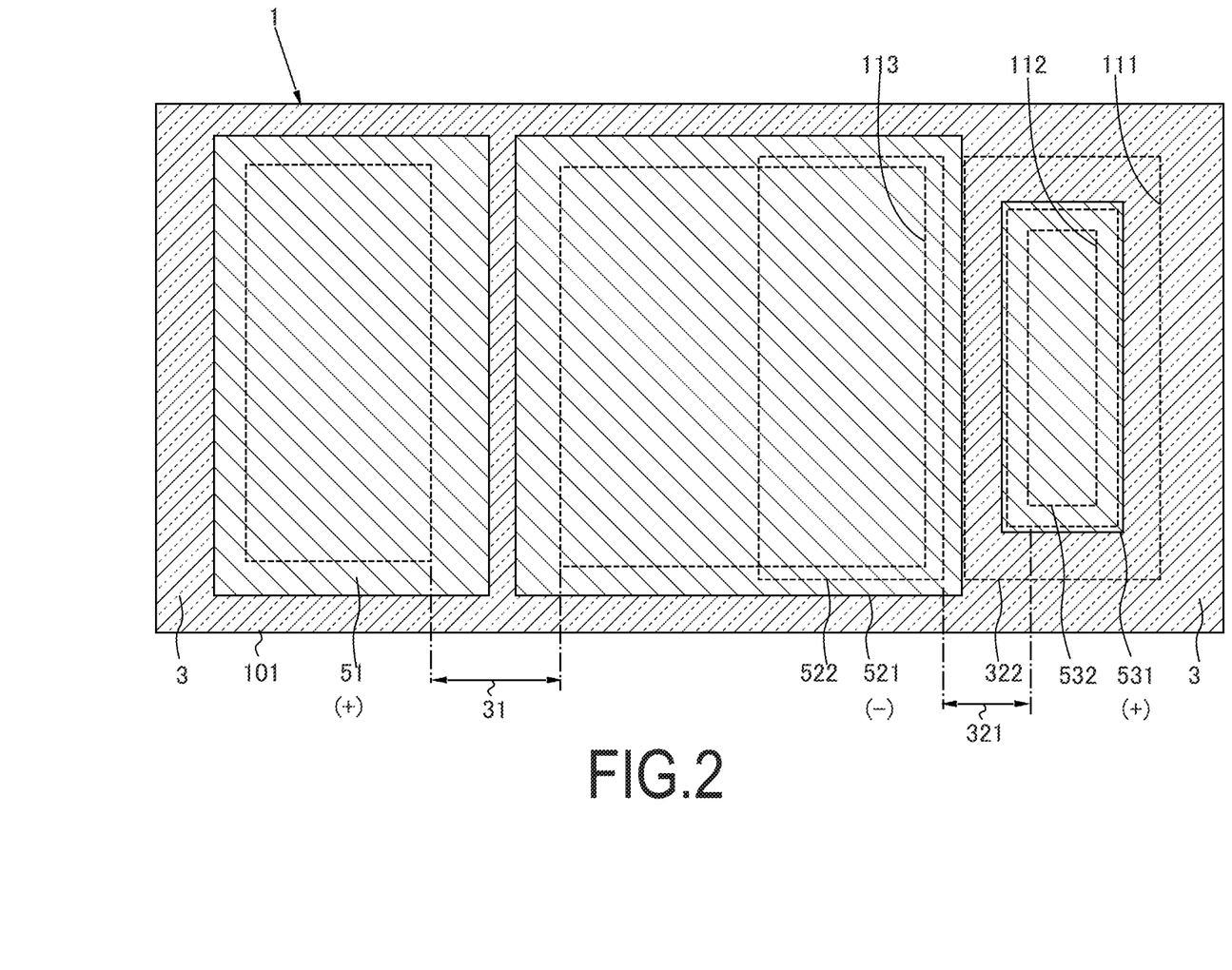
FIG. 2 is a bottom view of the integrate circuit device shown in FIG. 1.
Figure 3:
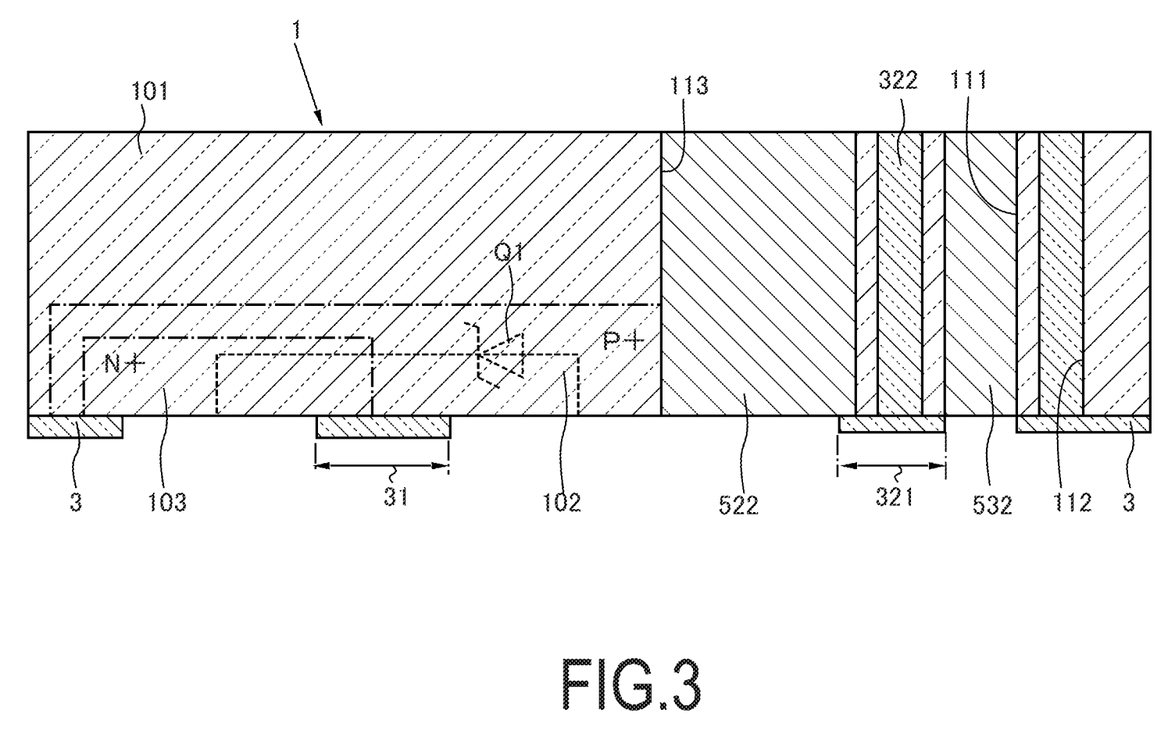
FIG. 3 is a drawing showing a state where terminal electrodes are removed from the integrate circuit device shown in FIGS. 1 and 2.
Figure 4:
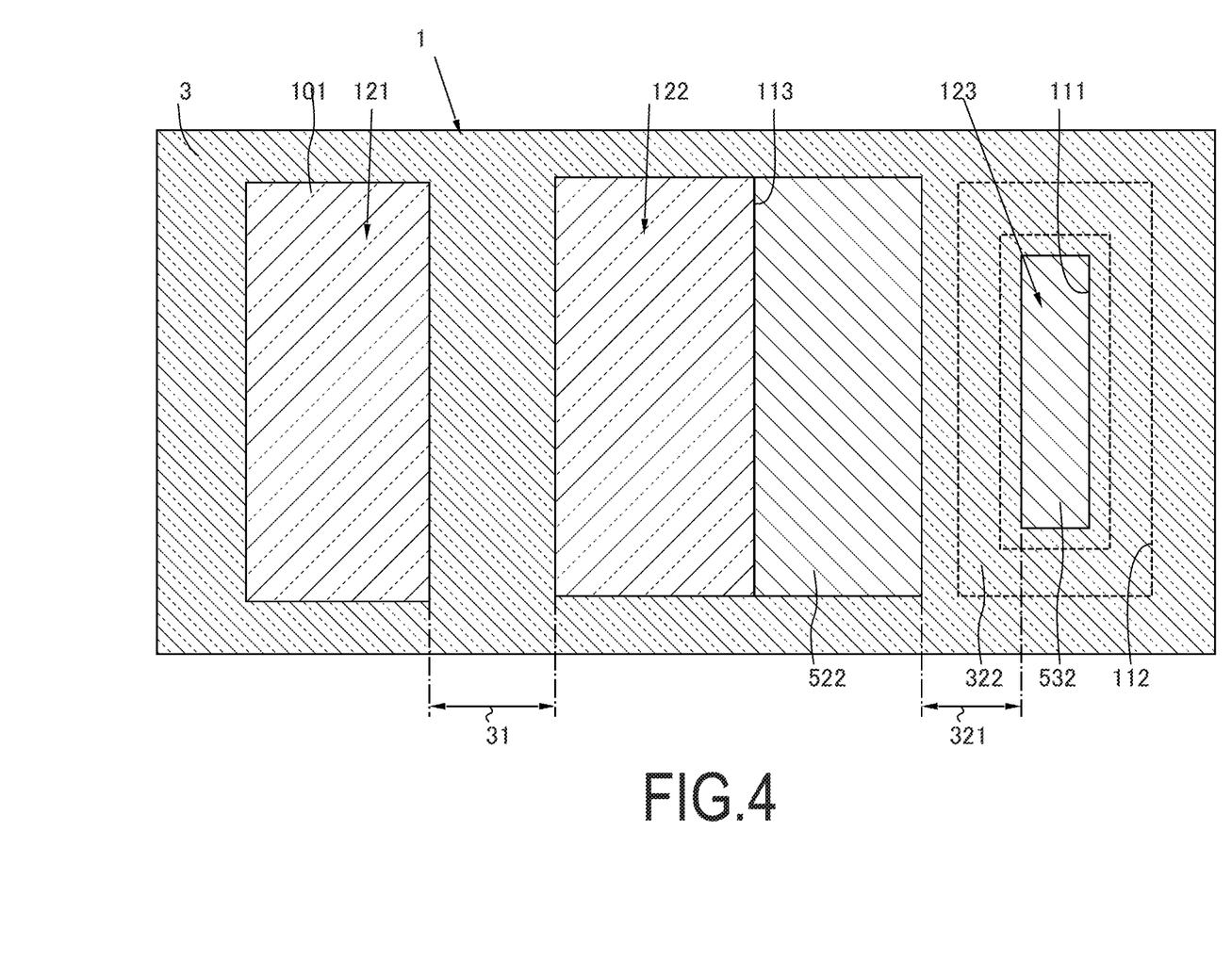
FIG. 4 is a bottom view of the integrate circuit device shown in FIG. 3.

The dielectric layer 31 lying on the first surface of the semiconductor substrate 101 may be made of the same material as the insulating film 321 or may be made of a different material. When the dielectric layer 31 is made of the same material as the insulating film 321, they may be made continuous with each other on the first surface of the semiconductor substrate 101, as shown in FIG. 2. In this case, as shown in FIGS. 3 and 4, a first window 121 through which the $N^+$ type semiconductor layer 103 should be exposed, a second window 122 through which the $N^+$ type and $P^+$ type semiconductor layers 103, 102 should be exposed, and a third window 123 through which the second conductor 532 should be exposed are formed at the areas where the first terminal electrode 51, the second terminal electrode 521 and the third terminal electrode 531 are to be formed. Then, the first terminal electrode 51, the second terminal electrode 521 and the third terminal electrode 531 are formed over the first window 121, the second window 122 and the third windows 123, respectively. However, it is also possible to separately provide the dielectric layer 31 and the insulating film 321 at the necessary areas.

The electronic component 7 is connected to constitute a desired electrical circuit together with the active element Q1 and the passive elements PS1, PS2 provided in the integrated circuit device 1. In this embodiment, the electronic component 7 may be, but not limited to, a light-emitting diode. Input terminals of the electronic component 7 are bonded to wiring patterns 54, 55 that are bonded to the other end of the second conductor 532 and the other end of the first conductor 522.

Figure 5:
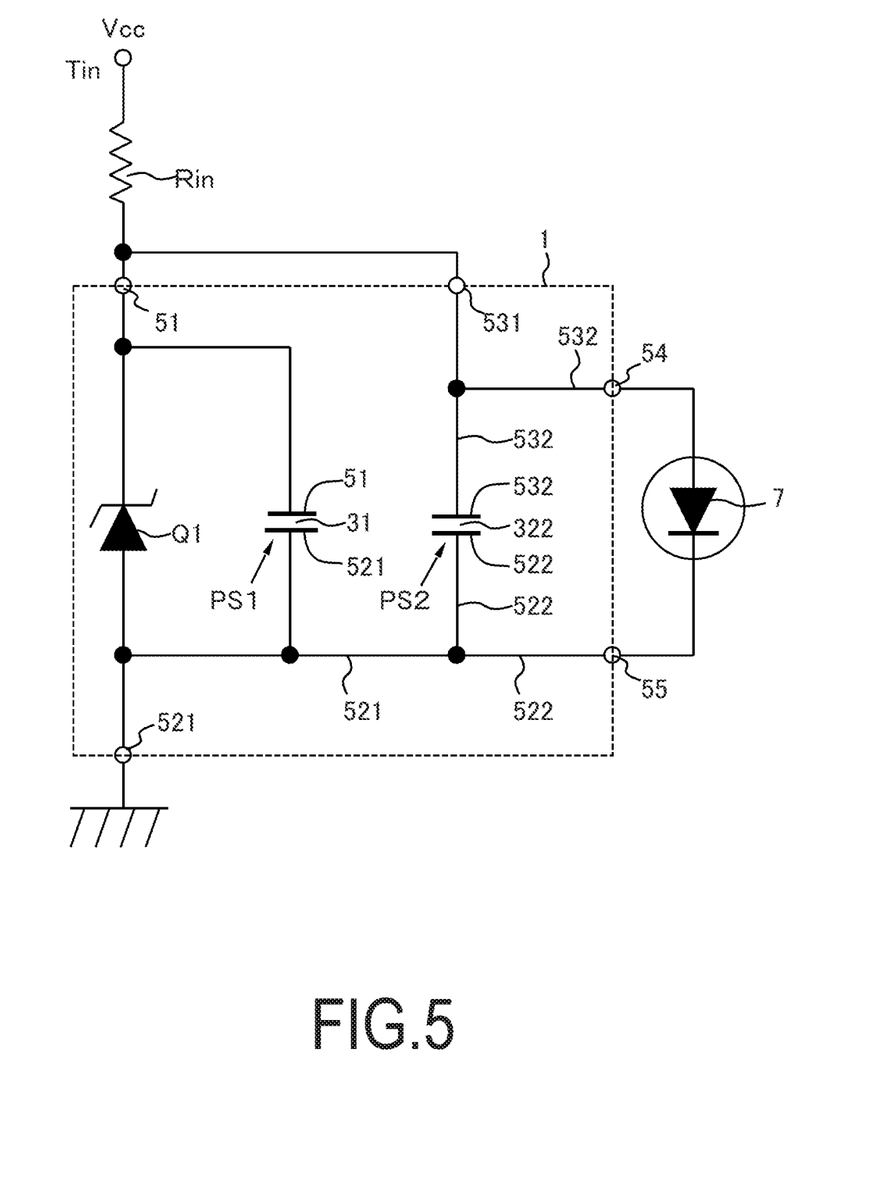
FIG. 5 is an electrical circuit diagram when the integrate circuit device shown in FIGS. 1 to 4 is in use.

The integrated circuit device shown in FIGS. 1 to 4 can be expressed as a circuit shown in FIG. 5. Referring to FIG. 5, between the first terminal electrode 51, which serves as a capacitor electrode and a positive power supply terminal, and the second terminal electrode 521, which serves as a negative power supply terminal, there is provided a circuit configuration in which the active element Q1 and the passive element PS1 are connected in parallel to each other.

Regarding the passive element PS2, one end of the second conductor 532 is connected in common with the first terminal electrode 51 by the third terminal electrode 531, while the other end is connected to the wiring pattern 54. On the other hand, one end of the first conductor 522 is connected to the second terminal electrode 521, while the other end is connected to the wiring pattern 55.

To the first terminal electrode 51, the DC power voltage Vcc is supplied via an input resistance Rin. On the other hand, the second terminal electrode 521 is grounded as a negative power supply terminal.

With this configuration, the electronic component 7 (light-emitting diode) can be supplied with a constant voltage which has been made into a constant voltage by the active element Q1 (zener diode) and mainly subjected to voltage stabilization due to the passive element PS2, thereby emitting light.

In the above, the second conductor 532, the dielectric layer 322 and the first conductor 522 constituting the passive element PS2 are embedded in the semiconductor substrate 101 along the thickness direction. Therefore, the built-in passive element PS2 does not increase the thickness of the semiconductor substrate 101. Thus, there can be obtained a thin integrated circuit device 1.

Furthermore, since the passive element PS2 is formed by utilizing the thickness of the semiconductor substrate 101, the passive elements PS2 can be arranged at high density, unlike the related art in which planar passive elements are arranged on the semiconductor substrate.

The first conductor 522 and the second conductor 532 may be formed by a plating deposition process but is preferably formed either by a molten metal filling process in which a molten metal is poured with the first element forming region 111 or the third element forming region 113 used as a mold or by a metal/alloy disperse system filling process in which poured is a disperse system having a metal/alloy powder dispersed in a disperse medium. This is because significant cost reduction can be achieved in both cases. When using the molten metal filling process or the metal/alloy disperse system filling process, it is possible to adopt a differential pressure filling process, wherein the semiconductor substrate 101 is placed in a vacuum chamber, the pressure is reduced by evacuation, a conductor forming filler is poured into the first element forming region 111 or the third element forming region 113, and then the internal pressure of the vacuum chamber is increased.

Then, the filler within the element forming region is pressurized using a pressing plate or the like and hardened by cooling under pressure. By adopting the molten metal filling process or the metal/alloy disperse system filling process, the growth of columnar crystal can be restrained, so that the first conductor 522 and the second conductor 532 have a nanocomposite crystal structure. Since the growth of columnar crystal is restrained and the formation of equiaxed crystal is facilitated by the effect of the above nanocomposite crystal structure, stress in the first conductor 522 and the second conductor 532 can be reduced.

When the passive element PS2 is a capacitor, one of the effective methods for forming the passive element PS2 is such that functional particles and a fluid functional material for forming a Si—O bond region filling up the space around the functional particles are filled into a required region and then hardened. For example, a dielectric paste is poured into the second element forming region 112, forming the dielectric layer 322. For example, the dielectric paste includes dielectric particles, Si particles and a liquid organic Si compound. When reacted with the Si particles, the organic Si compound forms a Si—O bond around the dielectric particles (which serve as an aggregate), thus serving to fill up the space around the dielectric particles. The material of the dielectric particles should be selected depending on the required capacitance. When a large capacitance is required, for example, barium titanate ferroelectric particles can be used.

Preferably, the dielectric particles and the Si particles have a particle size of nanometer order (equal to or less than 1 µm). The dielectric particles and the Si particles may have any shape and should not be construed as limited to a spherical shape. Moreover, the dielectric particles and the Si particles are not required to have a uniform particle size but may have various particle sizes within the nanometer range.

Preferably, the reaction between the organic Si compound and the Si particles is allowed to proceed under vacuum while being heated, for example, within a temperature range of 130° C. to 150° C. Organic substances resulting from the reaction by heating can be thermally decomposed and discharged as a gas. The dielectric layer 322 has a structure in which the space around the dielectric particles is completely filled up with the Si—O bond network, more specifically, amorphous silica ($SiO_2$).

More preferably, heating is performed such that the substances in the hole or groove (element forming region) are heated under pressure and then cooled under pressure. This process further accelerates the thermal decomposition of the organic substances and also increases the density of the dielectric layer 322, improving the adhesion to the semiconductor substrate 101.

Moreover, the Si—O bond filling up the space around the dielectric particles, more specifically, the amorphous silica ($SiO_2$) can be formed by reacting the organic Si compound with the Si particles. That is, since the formation of the oxide from the Si particles increases the volume, a highly reliable dielectric layer 322 can be formed in the element forming region, which is free from defects such as a gap, a void or a crack and has a high adhesion strength to the side wall of the second element forming region 112. It should be noted that the volume of the $SiO_2$ increases by about 30 to 35% from that of the Si particles. This corresponds to the shrinkage ratio of the Si particles, preventing the formation of a void, a gap or a crack due to the shrinkage.

A typical example of the organic Si compound is alkylalkoxysilane represented by the formula:

In this case, the reaction formula is as follows.

When the semiconductor substrate 101 is a Si substrate, the above reaction also occurs with Si of the Si substrate. Alternatively, it is also possible to use organopolysiloxane (alkoxysilane having a functional side chain). For instance, it is Si or disiloxane having an alkoxy group (RO), where R is an organic group.

Figure 6:
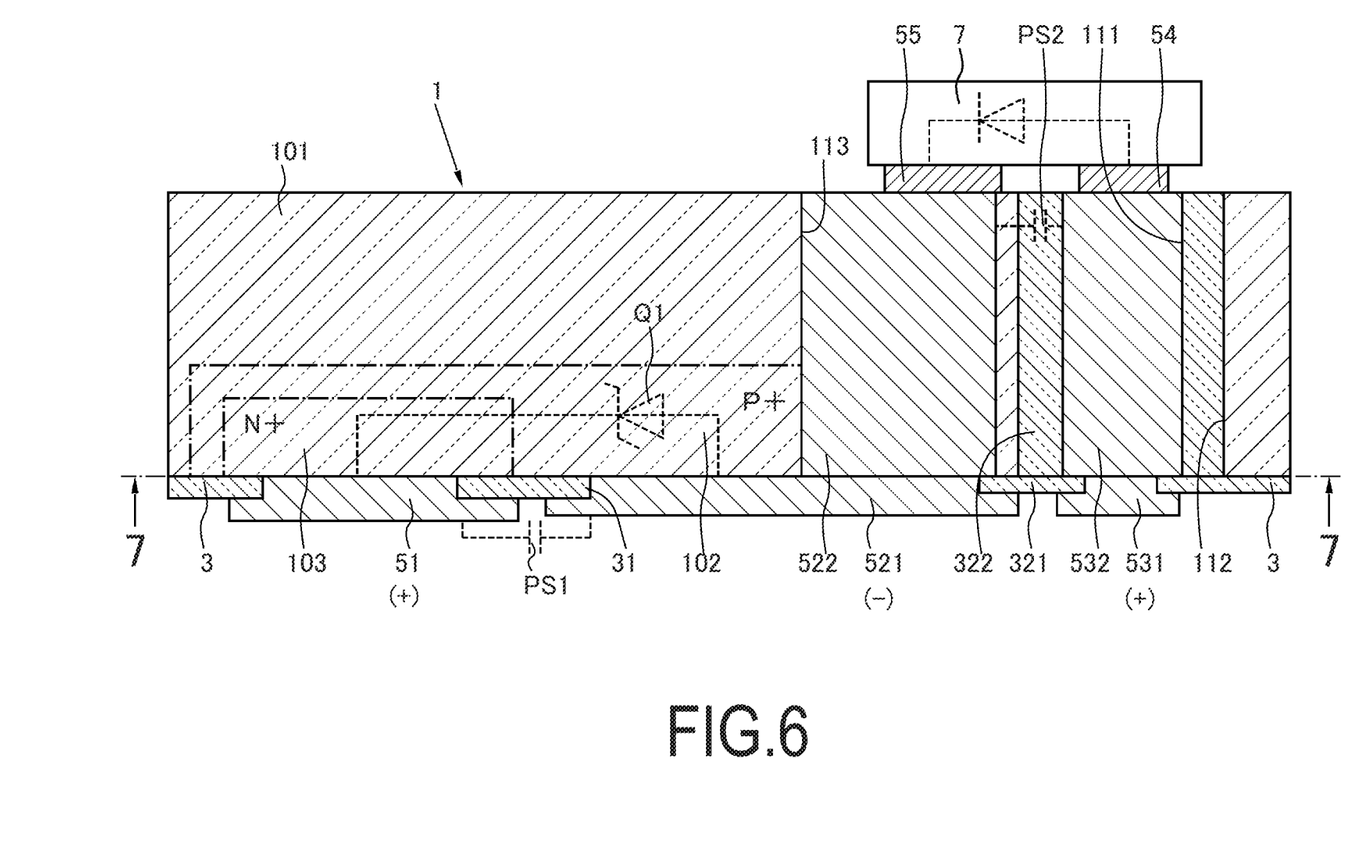
FIG. 6 is a drawing showing another embodiment of an integrated circuit device according to the present invention.
Figure 7:
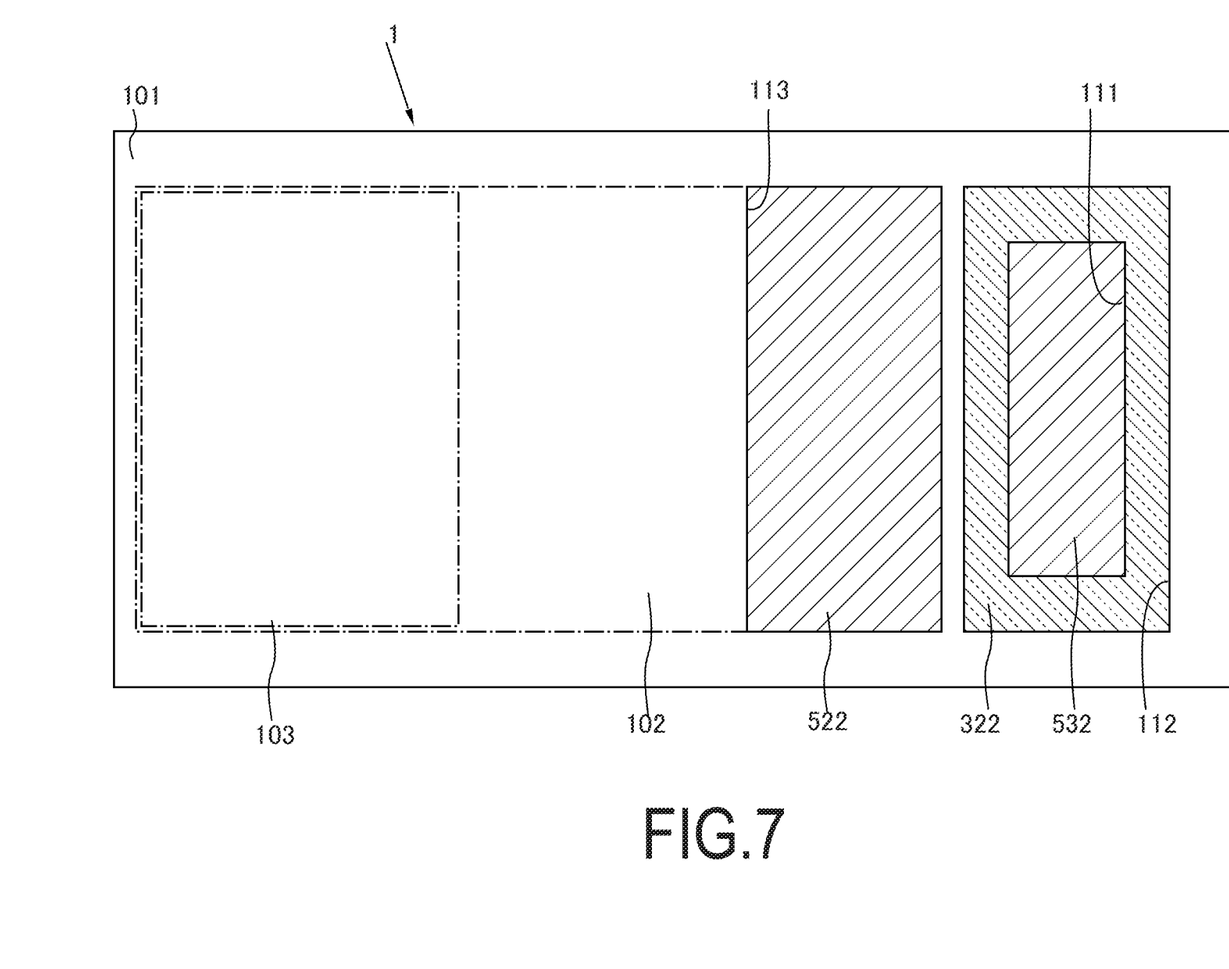
FIG. 7 is a sectional view taken along the line 7-7 in FIG. 6.

FIGS. 6 and 7 show another embodiment that is characterized in that the second conductor 532 is formed in the dielectric layer 322. The second conductor 532 may be formed by a plating deposition process but is preferably formed either by a molten metal filling process in which a molten metal is poured with the first element forming region 111 used as a mold or by a metal/alloy disperse system filling process in which poured is a disperse system having a metal/alloy powder dispersed in a disperse medium. This is because significant cost reduction can be achieved in both cases. When using the molten metal filling process or the metal/alloy disperse system filling process, it is possible to adopt a differential pressure filling process, wherein the semiconductor substrate 101 is placed in a vacuum chamber, the pressure is reduced by evacuation, a filler is poured into the dielectric layer 322, and then the internal pressure of the vacuum chamber is increased.

Then, the filler filled in the dielectric layer 322 is pressurized using a pressing plate or the like and hardened by cooling under pressure. This restrains the growth of columnar crystal to provide the second conductor 532 with a nanocomposite crystal structure. Since the growth of columnar crystal is restrained and the formation of equiaxed crystal is facilitated by the effect of the above nanocomposite crystal structure, stress can be reduced.

The inductor, the signal transmission element, the resistor and the optical waveguide element can also be manufactured according to the same process as described above.

Figure 8:
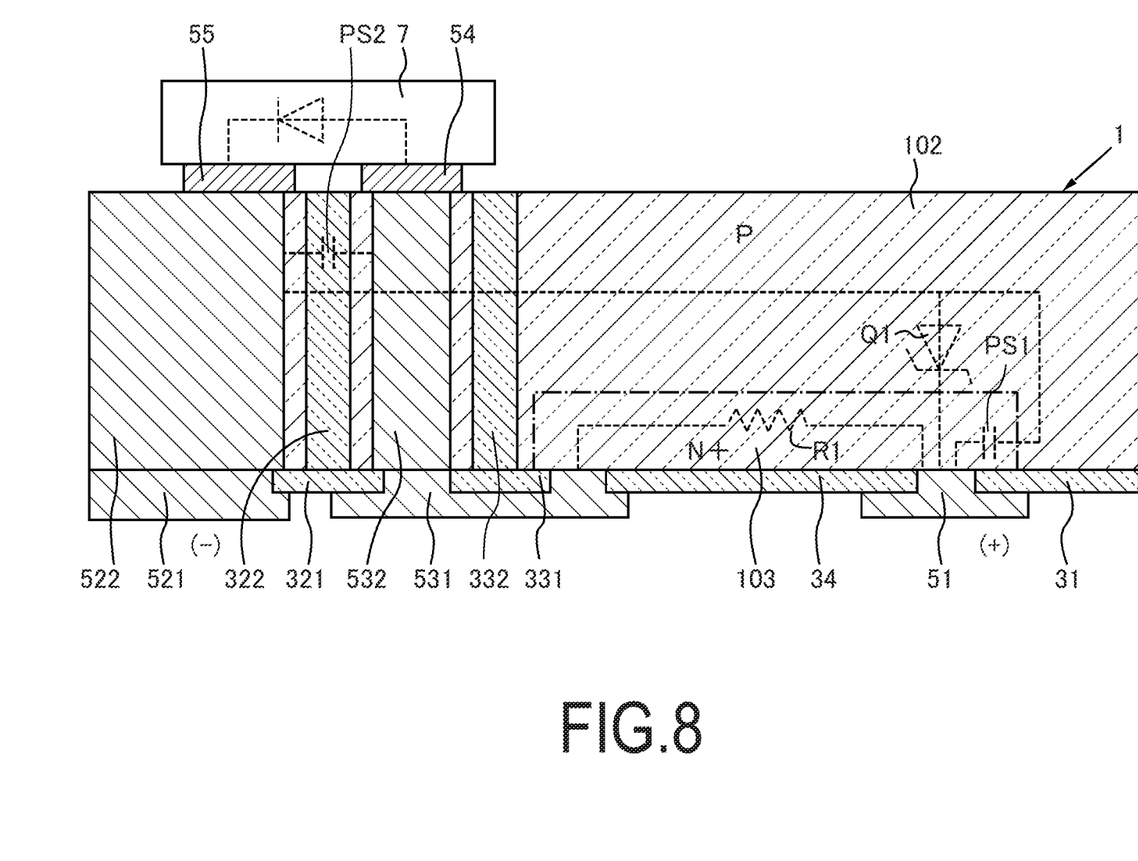
FIG. 8 is a drawing showing still another embodiment of an integrated circuit device according to the present invention.
Figure 9:
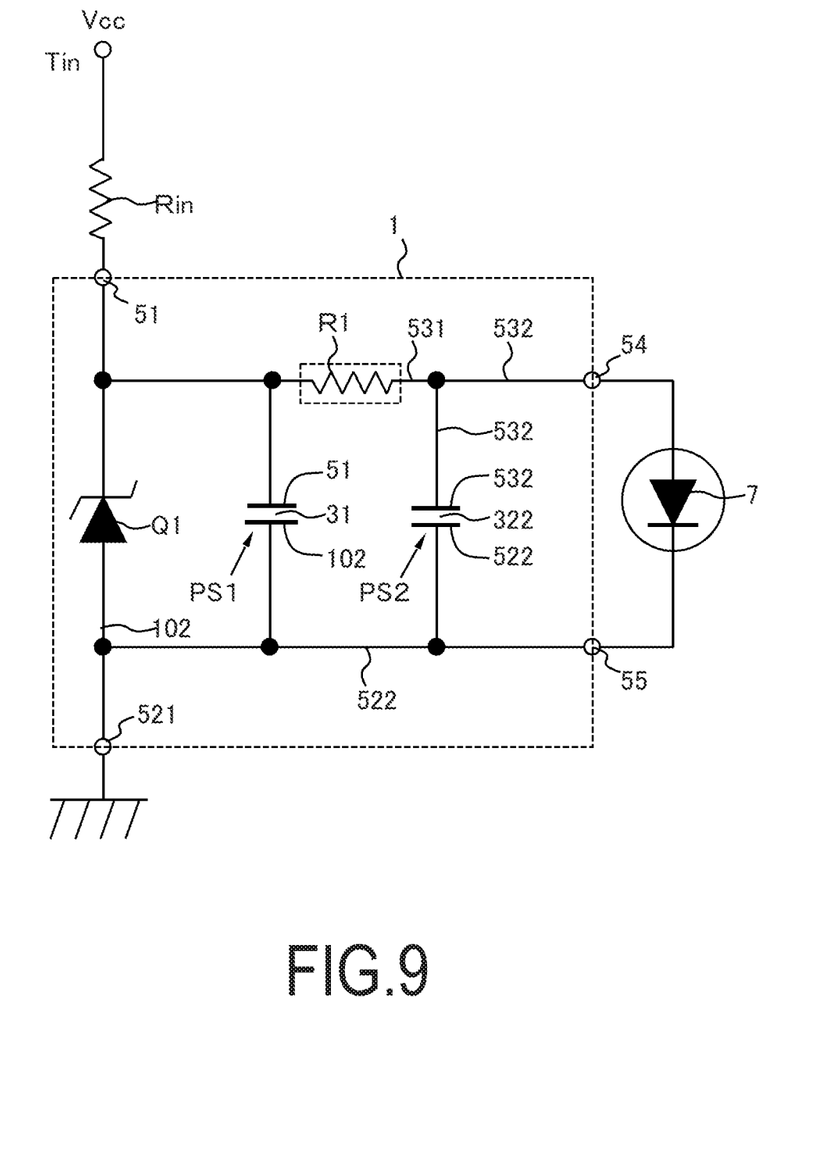
FIG. 9 is an electrical circuit diagram when the integrate circuit device shown in FIG. 8 is in use.

FIGS. 8 and 9 show still another embodiment that is characterized in that the load current-limiting resistor is realized with the resistance component of the active element Q1. Specifically, the first terminal electrode 51 and the third terminal electrode 531 are connected to the opposite ends of the N-type semiconductor layer 103, whereby the current flowing through the electronic component 7 (light-emitting diode) is limited by a DC resistance component R1 of the N-type semiconductor layer 103 generated between the first terminal electrode 51 and the third terminal electrode 531.

The integrated circuit device according to the present invention can be used for realizing the 3D-SiP technology, i.e., the combination of the 3D packaging and SiP (system in package) in which a system composed of a plurality of LSIs is enclosed in a single package. Specifically, it may be applied to a substrate with active and passive elements needed for a system LSI, a memory LSI, an image sensor, a MEMS, etc. It may also be applied to a system including an analog or digital circuit, a memory circuit such as DRAM, a logic circuit such as CPU, etc. It may also be applied to a sensor module, an optoelectronic module, a memory cell or integrated circuits (IC) thereof.

While the present invention has been particularly shown and described with respect to preferred embodiments thereof, it will be understood by those skilled in the art that various changes in form and detail may be made therein without departing from the spirit, scope and teaching of the invention.

What is claimed is:

1. An integrated circuit device comprising a semiconductor substrate, an active element and a passive element, the active element being a zener diode made of the semiconductor substrate, the zener diode comprising a $P^+$ type semiconductor region and an $N^+$ type semiconductor region, the zener diode made of the semiconductor substrate, the passive element being a capacitor comprising a first conductor, a second conductor and a dielectric layer between the first conductor and the second conductor, each of the first conductor, the second conductor and the dielectric layer filled in a groove or hole passing through the semiconductor substrate along a thickness direction thereof, the dielectric layer comprising a Si—O bond region obtained by reacting Si particles with an organic Si compound, the first conductor being directly connected to the $P^+$ type semiconductor region.

2. An electronic device comprising the integrated circuit device of claim 1 and an electronic component mounted on the semiconductor substrate of the integrated circuit device and electrically connected to the active element or the passive element.

3. An electronic device comprising the integrated circuit device of claim 1, the electronic device further comprising an electronic component mounted on the semiconductor substrate of the integrated circuit device and electrically connected to the active element or the passive element.

4. An electronic device comprising the integrated circuit device of claim 3, wherein the electronic component is a light-emitting diode, wherein the light-emitting diode is supplied with a constant voltage by the zener diode while being subjected to voltage stabilization due to the capacitor.

* * * * *